(12) United States Patent
Kubota et al.

(10) Patent No.: US 7,399,066 B2
(45) Date of Patent: Jul. 15, 2008

(54) PIEZOELECTRIC ELEMENT, INK JET RECORDING HEAD AND PRODUCING METHOD FOR PIEZOELECTRIC ELEMENT

(75) Inventors: Makoto Kubota, Kanagawa (JP); Motokazu Kobayashi, Kanagawa (JP); Shinji Eritate, Kanagawa (JP); Hisao Suzuki, Aichi (JP); Fumio Uchida, Osaka (JP); Chiemi Shimizu, Osaka (JP); Kenji Maeda, Osaka (JP)

(73) Assignees: Canon Kabushiki Kaisha, Tokyo (JP); Fuji Chemical Co. Ltd, Osaka (JP)

( * ) Notice: Subject to any disclaimer, the term of this patent is extended or adjusted under 35 U.S.C. 154(b) by 182 days.

(21) Appl. No.: 10/928,277

(22) Filed: Aug. 30, 2004

(65) Prior Publication Data
US 2005/0082943 A1 Apr. 21, 2005

(30) Foreign Application Priority Data
Sep. 3, 2003 (JP) ............................... 2003-311305

(51) Int. Cl.
*B41J 2/045* (2006.01)
*H01L 41/00* (2006.01)

(52) U.S. Cl. ............................... 347/68; 347/70; 310/363

(58) Field of Classification Search ............. 347/38–72; 310/363–365; 501/123
See application file for complete search history.

(56) References Cited

U.S. PATENT DOCUMENTS 6,315,853 B1 11/2001 Kubota et al.
6,392,265 B2 * 5/2002 Kondo et al. ................. 257/295
6,402,302 B1 6/2002 Ozaki et al.
6,402,303 B1 * 6/2002 Sumi ........................... 347/68
6,688,729 B1 2/2004 Imanaka et al.
6,739,703 B2 * 5/2004 Higuchi et al. ................. 347/70
7,187,024 B2 * 3/2007 Kobayashi et al. .......... 257/295
2004/0124482 A1 7/2004 Kobayashi et al.

FOREIGN PATENT DOCUMENTS

| EP | 0 969 530 | 1/2000 |
| JP | 9-92897 | 4/1997 |
| JP | 10-139594 | 5/1998 |
| JP | 10-290035 | 10/1998 |
| JP | 2000-79689 | 3/2000 |
| JP | 2003282987 | * 10/2003 |

OTHER PUBLICATIONS

Kumar, C., et al., "Lead Zirconate Titanate Films by Rapid Thermal Processing," *Applied Physics Letters*, vol. 58, No. 11, Mar. 18, 1991, pp. 1161-1163.
*Rikagaku Jiten* (Dictionary of Science), 5th Ed. (Iwanami Shoten Co., publisher), 1998, p. 1268.

* cited by examiner

*Primary Examiner*—Stephen D Meier
*Assistant Examiner*—Geoffrey Mruk
(74) *Attorney, Agent, or Firm*—Fitzpatrick, Cella, Harper & Scinto

(57) ABSTRACT

A piezoelectric element including a vibrating plate, a lower electrode, a piezoelectric film and an upper electrode laminated in this order, wherein the lower electrode, the upper electrode and the piezoelectric film are formed by a perovskite type oxide while the vibrating plate is formed by a metal oxide, and a junction interface is substantially absent between the vibrating plate and the lower electrode, between the lower electrode and the piezoelectric film and between the piezoelectric film and the upper electrode.

11 Claims, 3 Drawing Sheets

PIEZOELECTRIC ELEMENT, INK JET RECORDING HEAD AND PRODUCING METHOD FOR PIEZOELECTRIC ELEMENT

BACKGROUND OF THE INVENTION

1. Field of the Invention

The present invention relates to a piezoelectric element having a metal oxide ferroelectric film applicable to various dielectric devices by electric and/or optical properties, an ink jet recording head utilizing the same and a producing method for a piezoelectric element.

2. Related Background Art

A piezoelectric element is constituted of a crystalline piezoelectric ceramic material of a ferroelectric or paraelectric property. The piezoelectric ceramic material generally has a two-component composition principally constituted of lead zirconate titanate (hereinafter represented as "PZT"), or a three-component composition in which a third component is added to PZT of the two-component composition. A ferroelectric material utilizing a two-component PZT is described in Applied Physics Letters, 1991, vol. 58, No. 11, pp 1161-1163.

A ferroelectric thin film of such metal oxide type can be prepared, for example, by a sputtering, an MOCVD or a sol-gel method. The sol-gel method is executed by coating a substrate with a solution containing a hydrolysable compound of each raw material metal, a partially hydrolyzed product thereof or a partially polycondensed product thereof, then drying and heating the coated film in the air to form a metal oxide film, and executing a sintering at a crystallizing temperature or higher of the metal oxide to crystallize the film, thereby obtaining a ferroelectric thin film. As the hydrolysable metal compound for the raw material, an organic compound is generally employed, such as a metal alkoxide, a partially hydrolyzed product thereof or a partially polycondensed product thereof. The sol-gel method allows to obtain a ferroelectric film most inexpensively and most simply.

As a method similar to the sol-gel method, there is known a metalorganic decomposition (MOD) method. The MOD method is executed by coating a substrate with a solution containing a hydrolysable metalorganic compound, such as a β-diketone complex or a carboxylate salt of a metal, then heating the coated film in the air or in oxygen to achieve a solvent evaporation of the coated film and a pyrolysis of the metal compound to form a metal oxide film, and executing a sintering at a crystallizing temperature or higher to crystallize the film. In the present invention, the sol-gel method, the MOD method and any combination thereof will be collectively referred to as "sol-gel method".

Also, an ink jet recording head utilizing a piezoelectric element formed by the sol-gel method is disclosed. For example, Japanese Patent Application Laid-Open Nos. H09-092897, H10-139594 and H10-290035 disclose a process based on the sol-gel method, of coating a sol containing a piezoelectric material in plural divided portions on a lower electrode and repeating a heating process thereby forming a piezoelectric film of a piezoelectric element usable in an ink jet recording head.

Also various proposals have been made, as disclosed in Japanese Patent Application Laid-Open Nos. H09-092897, H10-139594 and H10-290035, for improving characteristics and operation reliability of the piezoelectric element employed as an actuator, in order to achieve an improvement in the performance and the durability of the ink jet recording head.

A piezoelectric material obtained by the sol-gel method is known to assume a columnar polycrystalline structure. The columnar structure is a structure in which a grain boundary is formed substantially perpendicularly to a direction along the thickness of the film, and has surface irregularities corresponding to the grain size. Such irregularities may cause an interfacial roughness to an upper electrode, thereby resulting in an increased leak current or a deterioration in the piezoelectric characteristics.

Also a prior piezoelectric element employ, as a lower electrode, a precious metal such as Ru or Pt or an oxide thereof, and an interfacial mismatching between the piezoelectric film and the lower electrode may cause a deterioration of electrical characteristics, such as an increased leak current or a loss in the dielectric breakdown resistance. Also in a piezoelectric element of a prior configuration, a perovskite type oxide such as barium titanate, strontium titanate or calcium titanate employed as the lower electrode may result in a deterioration of characteristics, particularly a displacement amount, of the piezoelectric film, because of a higher resistance of the electrode in comparison with the case of the precious metal. Furthermore, in the piezoelectric element of the prior configuration, an in-plane stress may be concentrated on a junction interface of a vibrating plate and a lower electrode, thereby leading to a peeling in a thermal treatment step in the manufacture or when the element is driven.

SUMMARY OF THE INVENTION

An object of the present invention is to provide a piezoelectric element in which a matching and an adhesion are improved between an upper electrode, a piezoelectric film, a lower electrode and a vibrating plate, to provide a long service life while maintaining satisfactory dielectric constant and electrical characteristics, an ink jet recording head utilizing such piezoelectric element, and a method for producing a piezoelectric element.

Another object of the present invention is to provide a piezoelectric element including a vibrating plate, a lower electrode, a piezoelectric film and an upper electrode laminated in this order, and characterized in that:

the lower electrode, the upper electrode and the piezoelectric film are formed by a perovskite type oxide while the vibrating plate is formed by a metal oxide; and a junction interface is substantially absent between the vibrating plate and the lower electrode, between the lower electrode and the piezoelectric film, and between the piezoelectric film and the upper electrode.

Still another object of the present invention is to provide a piezoelectric element including a vibrating plate, a lower electrode, a piezoelectric film and an upper electrode laminated in this order, and characterized in that:

the lower electrode, the upper electrode and the piezoelectric film are formed by a perovskite type oxide while the vibrating plate is formed by a metal oxide; and the piezoelectric element includes, between the vibrating plate and the lower electrode, a region where a substance constituting the vibrating plate and a substance constituting the lower electrode are mixed, also, between the lower electrode and the piezoelectric film, a region where a substance constituting the lower electrode and a substance constituting the piezoelectric film are mixed, and, between the piezoelectric film and the upper electrode, a region where a substance constituting the piezoelectric film and a substance constituting the upper electrode are mixed.

Still another object of the present invention is to provide a method for producing a piezoelectric element including a vibrating plate, a lower electrode, a piezoelectric film and an upper electrode laminated in this order, the method including:

a step of providing a vibrating plate material for forming the vibrating plate, on a substrate;

a step of drying the vibrating plate material;

a step of providing an electrode material for forming the lower electrode on the vibrating plate material;

a step of drying the electrode material;

a step of providing a piezoelectric material for forming the piezoelectric film, on the electrode material;

a step of drying the piezoelectric material; and a step of sintering the vibrating plate material, the electrode material and the piezoelectric material; in this order.

Still another object of the present invention is to provide a piezoelectric element including a vibrating plate, a lower electrode, a piezoelectric film and an upper electrode laminated in this order, and characterized in that:

a junction interface is substantially absent between the vibrating plate and the lower electrode, between the lower electrode and the piezoelectric film, and between the piezoelectric film and the upper electrode; and the piezoelectric element includes, between the vibrating plate and the lower electrode, a region where a substance constituting the vibrating plate and a substance constituting the lower electrode are mixed, also, between the lower electrode and the piezoelectric film, a region where a substance constituting the lower electrode and a substance constituting the piezoelectric film are mixed, and, between the piezoelectric film and the upper electrode, a region where a substance constituting the piezoelectric film and a substance constituting the upper electrode are mixed.

Still another object of the present invention is to provide a piezoelectric element including a vibrating plate, a lower electrode, a piezoelectric film and an upper electrode laminated in this order, and characterized in that:

the lower electrode, the upper electrode and the piezoelectric film are formed by a perovskite type oxide while the vibrating plate is formed by a metal oxide; and a junction interface is substantially absent between the vibrating plate and the lower electrode.

In producing a piezoelectric element by the sol-gel method, the present invention eliminates junction interfaces in the upper electrode/piezo-electric film/lower electrode/vibrating plate structure, thereby allowing to provide a piezoelectric element and an ink jet recording head showing a large remnant polarization and capable of providing a large displacement.

DESCRIPTION OF THE PREFERRED EMBODIMENTS

In the following, embodiments for executing the present invention will be explained. A piezoelectric element includes members constituting a vibrating plate, a lower electrode, a piezoelectric film and an upper electrode.

Figure 1:
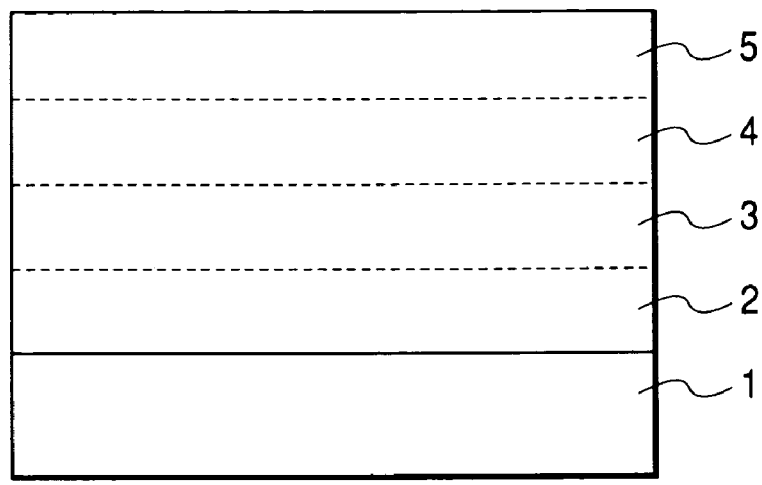
FIG. 1 is a schematic cross-sectional view showing a piezoelectric element of the present invention.

FIG. 1 is a view showing the configuration of an embodiment of the piezoelectric element of the present invention, including a substrate 1. A material for such substrate is not particularly restricted, but is preferably is a material not causing fusion or deformation in a thermal treatment process in a sol-gel method which is usually executed at 850° C. or lower. Also in case of forming an ink jet recording head with the piezoelectric element of the present invention, the substrate preferably serves also as a pressure chamber substrate for forming a pressure chamber. For such purpose, there is preferably employed a semiconductor substrate such as of silicon (Si) or tungsten (W), or a substrate of stainless steel (SUS), but there can also be employed a ceramic material such as zirconia, alumina or silica. It is also possible to employ these materials in a combination of plural kinds, or as laminates to form a multi-layered structure, or in a laminated structure in combination with a metal layer such as of platinum or palladium.

Referring to FIG. 1, a vibrating plate 2 in the invention is constituted of a metal oxide prepared by the sol-gel method. In the present invention, a preferred film thickness of the vibrating plate is not particularly restricted and is determined by a shape and physical properties of the piezoelectric film and peripheral members and an application of the element, but it is preferably within a general range of about 1 to 25 μm. Since the piezoelectric element of the invention does not have a distinct junction interface between the vibrating plate 2 and a lower electrode 3 adjacent thereto, the film thickness is measured when an uppermost part of the vibrating plate 2 is dried.

In the present invention, a term "drying" means a step of eliminating a solvent from a film obtained by coating a coating liquid. A desired metal oxide crystal is obtained by a "sintering" step by heating at a high temperature.

The metal oxide constituting the vibrating plate is not particularly limited in its type, but is preferably a material having an elastic modulus larger than that of a piezoelectric film, in case of a piezoelectric element requiring a large piezoelectric displacement as in an ink jet recording head. For example a metal oxide having a Young's modulus of 150 GPa or higher is advantageously employed. For example an oxide of aluminum, titanium zirconium or silicon or a mixture thereof can be easily produced by a sol-gel method, and can be advantageously employed in the present invention. Also, for the purpose of controlling a crystal density or an elastic modulus, such vibrating plate material may be doped with a small amount of a metal. However, the elastic modulus of a metal oxide is influenced not only by its composition but also producing conditions in the sol-gel method.

Also, use of a perovskite oxide prepared by the sol-gel method as the metal oxide constituting the vibrating plate 2 is more preferable in further improving a matching and an adhesion with the lower electrode constituted of a perovskite oxide. Specific examples of the perovskite oxide employable in the vibrating plate include a titanate salt such as strontium titanate ($SrTiO_3$), barium titanate ($BaTiO_3$) or calcium titanate ($CaTiO_3$), and another metallic acid salt such as of Nb, Ta, W, Mo, Fe, Co, Cr etc. It can also be a solid solution of plural components such as barium strontium titanate.

The perovskite oxide in the present invention is an oxide ideally having a perovskite structure which is a cubic crystal structure, as described in Rikagaku-Jiten (published by Iwanami Shoten). Such oxide constituting the vibrating plate 2 is produced by a sol-gel method.

The present invention is characterized, in producing a piezoelectric element by a sol-gel method, in simultaneously sintering a coating liquid which is coated previously and another coating liquid which is coated next, among a coating liquid for the lower electrode, a coating liquid for the upper electrode, a coating liquid for the piezoelectric film and a coating liquid for the vibrating plate. However, there is excluded a case where the lower electrode, the upper electrode and the piezoelectric film are constituted of a same substance. Also a substance constituting the lower electrode and a substance constituting the vibrating plate may be same. Stated differently, the vibrating plate may serve also as the lower electrode by selecting a conductive substance for the substance constituting the vibrating plate.

Such simultaneous sintering allows to obtain a piezoelectric element in which junction interfaces between all the adjacent members (a junction interface between the vibrating plate and the lower electrode, a junction interface between the lower electrode and the piezoelectric film, and a junction interface between the piezoelectric film and the upper electrode) are substantially absent. An expression that "the junction interface is substantially absent" means, in an observation of a piezoelectric element under a scanning electron microscope (SEM) or a transmission electron microscope (TEM), a state where a plane (junction interface) at which a layer formed solely by a substance constituting the piezoelectric film and a layer formed solely by a substance constituting the electrode (upper electrode or lower electrode) are in direct contact, or a plane (junction interface) at which a layer formed solely by a substance constituting the lower electrode and a layer formed solely by a substance constituting the vibrating plate are in direct contact, cannot be clearly recognized. The "substance constituting" each of the vibrating plate, lower electrode, piezoelectric film and upper electrode means a substance present in a member obtained by coating, drying and sintering singly a coating liquid used as the raw material of each member.

Also in a simultaneous sintering allows to obtain, in the piezoelectric element, a layer in which a substance constituting the lower electrode and a substance constituting the piezoelectric film are mixed, also a layer in which a substance constituting the upper electrode and a substance constituting the piezoelectric film are mixed, and a layer in which a substance constituting the lower electrode and a substance constituting the vibrating plate are mixed. Such layer in which substances constituting different members are mixed can be confirmed under an electron microscope (SEM) or a transmission electron microscope (TEM).

Such substantial elimination of the junction interface between the piezoelectric film and the electrode (upper electrode or lower electrode) and the junction interface between the lower electrode and the vibrating plate allows to increase the matching and the adhesion in the contact between the piezoelectric film and the electrode and between the lower electrode and the vibrating plate, thereby providing a piezoelectric element with satisfactory dielectric constant and electrical characteristics.

The coating liquids for the vibrating plate, the electrodes and the piezoelectric film can be prepared and coated by known methods.

A solvent to be used for a sol can be, for example, an alcohol solvent such as methanol, ethanol, n-butanol, n-propanol or isopropanol, an ether solvent such as tetrahydrofuran or 1,4-dioxane, a cellosolve solvent such as methyl cellosolve or ethyl cellosolve, an amide solvent such N,N-dimethylformamide, N,N-diethylacetamide or N-methylpyrrolidone, or a nitrile solvent such as acetonitrile. Among these, an alcohol solvent is preferable.

Also for hydrolyzing a solution containing a metal alkoxide and/or a metal salt, there can for example be employed water of 0.05 to 2 molar amounts of the metal alkoxide and/or metal salt, preferably 0.5 to 1.5 molar amounts.

For such hydrolysis, there may also be employed an acid catalyst and/of a base catalyst, preferably an inorganic acid such as hydrochloric acid or an organic acid such as acetic acid.

For coating a coating liquid for sol-gel method, a known coating method such as spin coating, dip coating, bar coating or spray coating may be utilized. Each coating liquid may be coated and dried once, or may be coated and dried plural times in order to obtain a desired film thickness. Thus an oxide film constituting the vibrating-plate 2 can be obtained by coating and drying a coating liquid, which is prepared by dissolving a metal alkoxide and/or a metal hydroxide in a solvent and executing a hydrolysis by addition of water, on a substrate 1, and executing a sintering in a heat treatment step thereafter.

Referring to FIG. 1, each of a lower electrode 3 and an upper electrode 5 is formed by a perovskite oxide of a thickness of about 10 to 500 nm, prepared by a sol-gel method. The perovskite oxide can preferably be $M1RuO_3$ (M1 being at least one selected from a group of Sr, Ba and Ca), or $Sr_{(1-x)}M2_{(x)}CoO_3$ (M2 being at least one selected from a group of La, Pr, Sm and Nd; and x being $0 \leq x < 1$). Such oxide is preferably prepared by a sol-gel method as in the case of the vibrating plate 2).

For example, for the perovskite oxide $M1RuO_3$ (M1 being at least one selected from a group of Sr, Ba and Ca), there is employed a coating liquid for the electrode prepared from ruthenium alkoxide or ruthenium hydroxide and an alkoxide of metal M1.

The coating liquid for the electrode is coated and dried on the vibrating plate 2 in case of forming the lower electrode 3, or on a piezoelectric film 4 to be explained later, in case of forming the upper electrode 5. A thickness of the electrode (lower electrode or upper electrode) after drying is not particularly restricted, but is preferably 0.01 to 0.5 μm. The upper electrode and the lower electrode may be mutually same or different in constituting substance and thickness.

Referring to FIG. 1, a piezoelectric film 4 in the present invention is represented by a general formula $Pb_{(1-x)}La_x(Zr_yTi_{1-y})O_3$ (wherein $0 \leq x < 1$ and $0 \leq y \leq 1$), which is preferably prepared by a sol-gel method. The piezoelectric film can be obtained by coating and drying a coating liquid, which is prepared by dissolving an alkoxide and/or a hydroxide of Pb, La, Zr or Ti in a solvent and executing a hydrolysis by addition of water, on a lower electrode 3, and executing a sintering in a heat treatment step thereafter.

The Pb alkoxide can be lead 2-ethoxyethoxide, lead 2-methoxide, lead ethoxide, lead n-propoxide, lead i-propoxide, lead n-butoxide, lead i-butoxide, lead t-butoxide, lead hydroxide etc. or an alkyl-substituted compound thereof.

There can also be employed an alkoxide in situ synthesized by mixing an inorganic lead salt such as a chloride, a nitrate, a phosphate or a sulfate, or an organic salt for example a carbolic acid salt such as a formate, an acetate, a propionate, an oxalate, a citrate, or a maleate, a hydroxycarboxylic acid salt or an acetylacetonate complex, with a solvent. La, Zr or Ti can also be employed similarly as a alkoxide or an inorganic salt. An alkoxide or an inorganic salt of Pb, La, Zr or Ti is dissolved in the aforementioned solvent and is hydrolyzed to execute a polymerization, thereby obtaining a coating liquid for the piezoelectric film.

In case of producing $Pb_{(1-x)}La_x(Zr_yTi_{1-y})O_3$ (wherein $0 \leq x < 1$ and $0 \leq y \leq 1$), the constituent metals may be charged in a stoichiometric ratio, but, since a Pb loss takes place in the sintering step at the film formation, it is preferable to increase the Pb amount at the preparation of the coating liquid. More specifically, with respect to the stoichiometric ratio represented by $Pb_{(1-x)}La_x(Zr_yTi_{1-y})O_3$ (wherein $0 \leq x < 1$ and $0 \leq y \leq 1$), Pb is made excessive by 5 to 50% in molar ratio.

In the preparation of the piezoelectric element of the present invention, the aforementioned coating liquid for the piezoelectric film is coated and dried on the lower electrode 3. The coating and drying may be executed once, or plural times in order to obtain a desired film thickness. A film thickness after drying per coating is not particularly restricted, but is preferably 0.01 to 5 μm. Also the piezoelectric film preferably has a total film thickness of about 1 to 30 μm. In the following, there will be explained a method for producing the piezoelectric element of the present invention.

(Vibrating Plate)

The coating liquid for the vibrating plate, prepared by a sol-gel method, is coated and dried on the substrate to obtain a vibrating plate precursor. Thereafter, the vibrating plate precursor is sintered together with a lower electrode precursor obtained by coating and drying thereafter, thereby obtaining a vibrating plate. A drying temperature after the coating is variable depending on the type of the contained solvent, but is preferably about 100° C. or higher but less than 300° C. For obtaining a vibrating plate of a desired thickness, the coating and the drying may be repeated plural times.

Also the sintering may be executed in an arbitrary atmosphere such as an inert gas atmosphere, an oxygen-containing atmosphere (for example air), or a vapor atmosphere, and may be executed under a normal pressure or a reduced pressure. The sintering is usually executed by elevating the temperature from the room temperature to about 300 to 850° C. in the air and maintaining such temperature for several minutes to 24 hours. Also at the sintering, the temperature elevation may be executed stepwise. Such sintering almost eliminates the organic component, thereby providing a vibrating plate of a dense structure.

(Lower Electrode)

On a vibrating plate precursor obtained by coating and drying on at least an uppermost part of the vibrating plate, a coating liquid for the lower electrode is coated and dried to obtain a lower electrode precursor. For forming such transition portion from the vibrating plate to the lower electrode, it is also possible to mix a coating liquid for the vibrating plate and a coating liquid for the lower electrode and to simultaneously coat both coating liquids. Such simultaneous coating can effectively achieve a simplification of manufacture and a penetration between the different coating liquids. In such case, a mixing ratio of the coating liquid for the vibrating plate and that for the electrode is preferably within a range of 1:50 to 50:1 in solid mass, more preferably 1:9 to 9:1.

Then the vibrating plate precursor and the lower electrode precursor are sintered simultaneously. Conditions of coating, drying and sintering for the coating liquid for the lower electrode are preferably similar to those for the oxide constituting the vibrating plate. The coated coating liquid for the lower electrode penetrates in the vicinity of the surface of the vibrating plate precursor. Thereafter the coating liquid for the lower electrode is dried, and is sintered simultaneously with the precursor in at least an uppermost portion of the vibrating plate, whereby crystals of the vibrating plate and the lower electrode grow in mixed manner at a contact plane thereof, thereby substantially eliminating a junction interface (a broken-lined portion in FIG. 1 between 2 and 3). It is also possible to simultaneously sinter the vibrating plate precursor, obtained by coating and drying plural times, and the lower electrode precursor.

(Piezoelectric Film)

On a lower electrode precursor obtained by coating and drying on at least an uppermost part of the lower electrode, a coating liquid for the piezoelectric film is coated. For forming such transition portion from the lower electrode to the piezoelectric plate, it is also possible to mix a coating liquid for the lower electrode and a coating liquid for the piezoelectric film and to simultaneously coat both coating liquids. Such simultaneous coating can effectively achieve a simplification of manufacture and a penetration between the different coating liquids. In such case, a mixing ratio of the coating liquid for the lower electrode and that for the piezoelectric film is preferably within a range of 1:50 to 50:1 in solid mass, more preferably 1:9 to 9:1. The coating liquid for the piezoelectric film thus coated is dried to obtain a piezoelectric film precursor. Then the lower electrode precursor and the piezoelectric film precursor are sintered simultaneously. The coated coating liquid for the piezoelectric film penetrates in the vicinity of the surface of the lower electrode precursor. Thereafter the coating liquid for the piezoelectric film is dried, and is sintered simultaneously with the precursor in at least an uppermost portion of the lower electrode, whereby crystals of the lower electrode and the piezoelectric film grow in mixed manner at a contact plane thereof, thereby substantially eliminating a junction interface (a broken-lined portion in FIG. 1 between 3 and 4). The sintering may be executed in an arbitrary atmosphere such as an inert gas atmosphere, an oxygen-containing atmosphere (for example air), a lead oxide atmosphere or a vapor atmosphere, and may be executed under a normal pressure or a reduced pressure. Conditions of coating, drying and sintering are preferably similar to those for the oxide constituting the vibrating plate. It is also possible to simultaneously sinter the lower electrode precursor, obtained by coating and drying plural times, and the piezoelectric film precursor.

(Upper Electrode)

The upper electrode is prepared on the piezoelectric film, in a similar manner as the lower electrode. More specifically, on a piezoelectric film precursor obtained by coating and drying on at least an uppermost part of the piezoelectric film, a coating liquid for the upper electrode is coated and dried to obtain an upper electrode precursor. Then such upper electrode precursor is simultaneously sintered with the piezoelectric film precursor to obtain an upper electrode. Also for such transition portion, it is possible to mix a coating liquid for the upper electrode and a coating liquid for the piezoelectric film and to simultaneously coat both coating liquids. Such simultaneous coating can effectively achieve a simplification of manufacture and a penetration between the different coating liquids.

The coated coating liquid for the upper electrode penetrates in the vicinity of the surface of the piezoelectric film precursor. The coating liquid for the upper electrode is coated, dried, and is sintered simultaneously with the precursor in at least an uppermost portion of the piezoelectric film, whereby crystals of the upper electrode and the piezoelectric film grow in mixed manner at a contact plane thereof, thereby substantially eliminating a junction interface.

Figure 2:
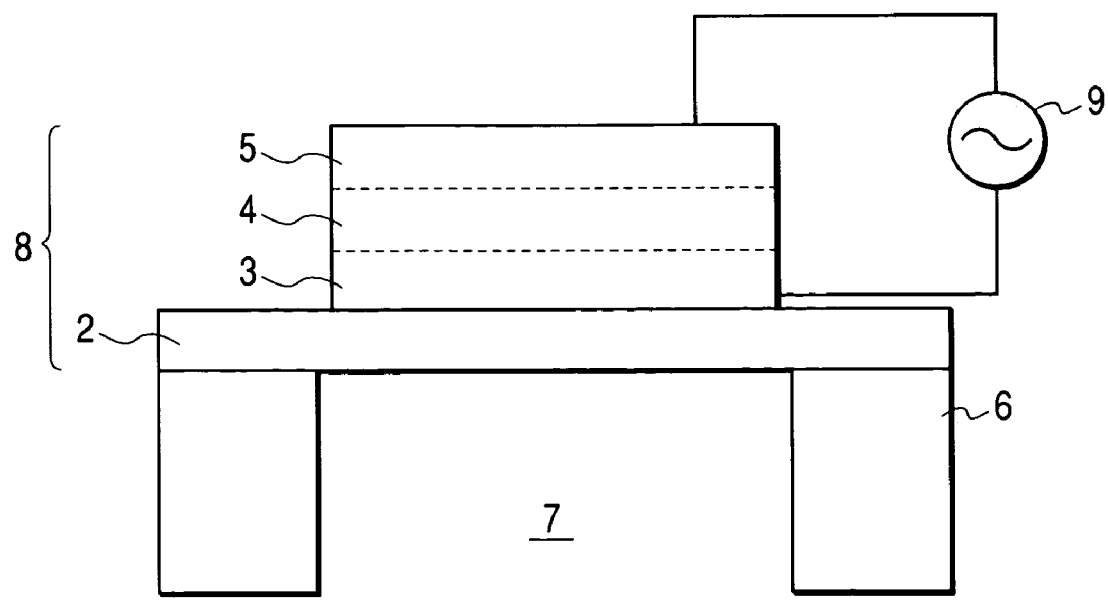
FIG. 2 is a schematic cross-sectional view showing a state where the piezoelectric element of the present invention is employed as an actuator of an ink jet printer head.

FIG. 2 shows an embodiment of the present invention, and is a partially magnified schematic view of an ink jet printing head in which a piezoelectric element is employed as an actuator. The printing head has a basic configuration similar to a prior head, and is constituted of a head base 6 and a piezoelectric element 8 (vibrating plate 2, piezoelectric film 4 and electrodes 3, 5). The head base 6 is provided, at a bottom face thereof, with a nozzle portion including a plurality of ink nozzles (not shown) for discharging ink, and a plurality of ink paths (not shown) respectively communicating with the ink nozzles.

Also an ink chamber 7, surrounded by the vibrating plate 2, the head base 6 and the nozzle portion, is formed in plurality, and communicates individually to each ink path. The vibrating plate 2 is mounted so as to cover the entire upper surface of the head base 6 thereby closing upper apertures of all the ink chambers 7 on the head base 6. The vibrating plate 2 in each piezoelectric element 8 is formed in a position individually corresponding to each ink chamber 7. A power source 9 controls a plurality of the piezoelectric elements 8 and applies a voltage to selected piezoelectric elements 8 in desired positions, thereby causing a vibration in the vibrating plates 2 of such elements. Thus the ink chambers 7 show a volume change in portions corresponding to the vibrations of the vibrating plates 2 whereby the ink is discharged through the ink paths and from the ink nozzles to achieve a printing.

In the following, there will be explained more specific examples of the present invention. Coating liquids including $Al_2O_3$ and $SrTiO_3$ respectively, was prepared as a coating liquid for the vibrating plate.

(Preparation of $Al_2O_3$ Coating Liquid): Liquid A

Aluminum sec-butoxide and ethyl acetoacetate as a stabilizer were dissolved in 2-propanol under heating, and a hydrolysis with diluted hydrochloric acid was conducted to obtain a coating liquid for vibrating plate of 20 mass % (calculated as oxide amount).

(Preparation of $SrTiO_3$ Coating Liquid): Liquid B

Strontium ethoxide and titanium isopropoxide in proportions corresponding to $SrTiO_3$ were dissolved in ethylene glycol monomethyl ether under heating, and were hydrolyzed under refluxing for 24 hours to obtain a coating liquid for vibrating plate of 15 mass % (calculated as oxide amount).

Also a coating liquid for an electrode was prepared with $SrRuO_3$ and $Sr_{0.5}La_{0.5}CoO_3$.

(Preparation of $SrRuO_3$ Coating Liquid): Liquid C

Strontium 2,4-pentanedionate and ruthenium 2,4-pentanedionate in proportions corresponding to $SrRuO_3$ were dissolved in methoxyethanol under heating, and were hydrolyzed with diluted hydrochloric acid to obtain a coating liquid for electrode containing $SrRuO_3$ by 10 mass % (calculated as oxide amount).

(Preparation of $Sr_{0.5}La_{0.5}CoO_3$ Coating Liquid): Liquid D

Strontium 2,4-pentanedionate, lanthanum isopropoxide and cobalt 2,4-pentanedionate in proportions corresponding to $Sr_{0.5}La_{0.5}CoO_3$ were dissolved in 2-propanol under heating, and were hydrolyzed with diluted hydrochloric acid to obtain a coating liquid for electrode containing $Sr_{0.5}La_{0.5}CoO_3$ by 10 mass % (calculated as oxide amount).

Also a coating liquid for a piezoelectric film having a composition $Pb_{1.1}La_{0.01}Zr_{0.52}Ti_{0.48}O_3$ was prepared.

(Preparation of $Pb_{1.1}La_{0.01}Zr_{0.52}Ti_{0.48}O_3$ Coating Liquid): Liquid E Lead acetate, lanthanum isopropoxide, zirconium butoxide and titanium isopropoxide in proportions corresponding to $Pb_{1.1}La_{0.01}Zr_{0.52}Ti_{0.48}O_3$ were dissolved in methoxyethanol under heating, and were hydrolyzed with diluted hydrochloric acid to obtain a coating liquid for piezoelectric film containing $Pb_{1.1}La_{0.01}Zr_{0.52}Ti_{0.48}O_3$ by 10 mass % (calculated as oxide amount). Also a following commercial PZT coating liquid was employed:

PZT Film Forming Agent (A6) Manufactured by Mitsubishi Material Co.: Liquid F.

Examples of piezoelectric element and producing method thereof are shown in Examples 1 to 2.

EXAMPLE 1

Figure 3A:
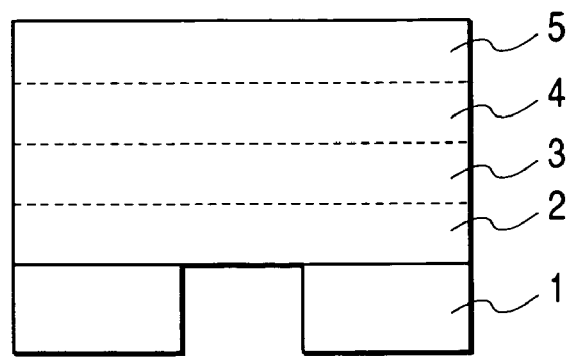
FIGS. 3A and 3B are respectively a schematic cross-sectional view and a rear plan view of a piezoelectric element prepared in Examples 1 and 2.
Figure 3B:
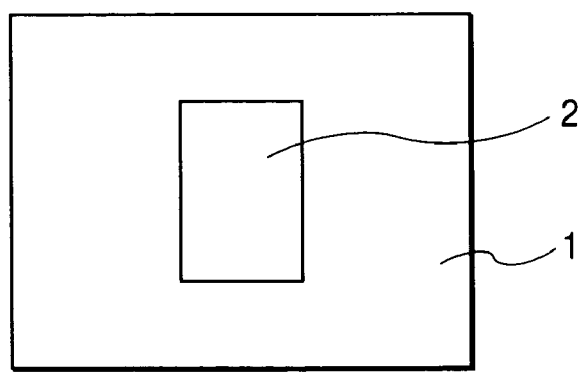

For forming a vibrating plate, the liquid A mentioned above was coated with a spin coater on a silicon single crystal substrate and dried for 5 minutes on a hot plate of 150° C. This operation was repeated 6 times to obtain a vibrating plate precursor of a thickness of about 5 μm. On the surface thereof, the liquid C mentioned above was similarly coated with a spin coater. The coated film was dried for 5 minutes on a hot plate of 150° C. to obtain a lower electrode precursor. Then on the surface thereof, the liquid F was similarly coated with a spin coater as a piezoelectric film, and dried for 5 minutes at 250° C. to obtain a piezoelectric film precursor. The vibrating plate precursor, the lower electrode precursor and the piezoelectric film precursor thus obtained were simultaneously sintered in an electric oven of 700° C. for 10 minutes. Thereafter the coating, drying and sintering of the liquid F were repeated 10 times. Then the liquid F were coated and dried to obtain a piezoelectric film precursor. The liquid C was coated thereon and dried for 5 minutes at 150° C. to obtain an upper electrode precursor. Then the piezoelectric film precursor and the upper electrode precursor were simultaneously sintered in an electric oven of 700° C. for 10 minutes. Finally, a part of a rear surface of the substrate was etched through by a wet etching to obtain a piezoelectric element of the present invention as shown in FIGS. 3A and 3B.

EXAMPLE 2

For forming a vibrating plate as in Example 1, the liquid B mentioned above was coated with a spin coater on a silicon single crystal substrate and dried for 5 minutes on a hot plate of 300° C. This operation was repeated 10 times to obtain a vibrating plate precursor of a thickness of about 4 μm. On the surface thereof, the liquid D mentioned above was similarly coated with a spin coater and was dried for 5 minutes at 150° C. to obtain a lower electrode precursor. Then the vibrating plate precursor and the lower electrode precursor were simultaneously sintered for 10 minutes at 700° C. Then the liquid D was further coated and dried for 5 minutes at 100° C. to obtain a lower electrode precursor. Then on the surface thereof, the liquid E was coated with a spin coater and dried for 5 minutes at 100° C. to obtain a piezoelectric film precursor. The lower electrode precursor and the piezoelectric film precursor were simultaneously sintered in an electric oven of 700° C. for 10 minutes. Thereafter the coating, drying and sintering of the liquid E were repeated 15 times. Then the liquid E were coated and dried thereon to obtain a piezoelectric film precursor. The liquid D was coated thereon and dried for 5 minutes at 150° C. to obtain an upper electrode precursor. Then the piezoelectric film precursor and the upper electrode precursor were simultaneously sintered in an electric oven of 700° C. for 10 minutes. The liquid D was further coated, dried and sintered once thereon to form the upper electrode. Finally, a part of a rear surface of the substrate was etched through by a wet etching to obtain a piezoelectric element of the present invention.

COMPARATIVE EXAMPLE 1

On a zirconia substrate having a partial aperture, a zirconia foil of a thickness of 10 μm was adhered to obtain a substrate with a vibrating plate. On the surface thereof, a platinum film of a thickness of about 200 nm was formed by sputtering, as a lower electrode. Then the liquid F was similarly coated, dried for 5 minutes at 250° C. and sintered for 10 minutes in an electric oven of 700° C. The coating, drying and sintering of the liquid F were repeated 11 times. A gold film of a thickness of about 50 nm was formed thereon as an upper electrode by an ion coater, whereby a piezoelectric element of a comparative example was obtained.

<Method of Evaluation>

Examples 1, 2 and Comparative Example 1 were evaluated in the following manner. A cross section from the upper electrode to the vibrating plate was observed under a transmission electron microscope (TEM) to confirm presence or absence of junction interfaces of the upper electrode, the piezoelectric film, the lower electrode and the vibrating plate. The samples showed a case where the junction interface could be clearly confirmed (interface present), a case where a boundary line resembling a junction interface was observable (interface almost absent) and a case where the junction interface could not be identified at all (interface absent). Also the characteristics of the piezoelectric member were evaluated by measuring a displacement amount by piezoelectric vibration with the laser doppler method, under an application of an AC current of 10 kHz and 10 V between the upper electrode and the lower electrode. Results are shown in Table 1. As shown in Table 1, the sample without the junction interface showed a large displacement amount and a satisfactory operation after a durability test for 720 hours.

TABLE 1

|  | TEM observation | Initial displacement (μm) | Displacement after drive for 720 hours (μm) |
|---|---|---|---|
| Example 1 | interface absent | 2.3 | 2.0 |
| Example 2 | interface absent | 2.8 | 2.5 |
| Comp. Ex. 1 | interface present | 1.1 | 0.1 |

(Preparation of Ink Jet Recording Head)

Figure 4:
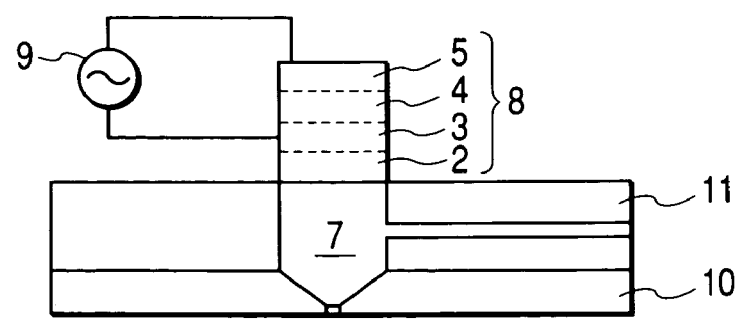
FIG. 4 is a schematic cross-sectional view showing a head employed in an evaluation of the ink jet recording head.
Figure 5:
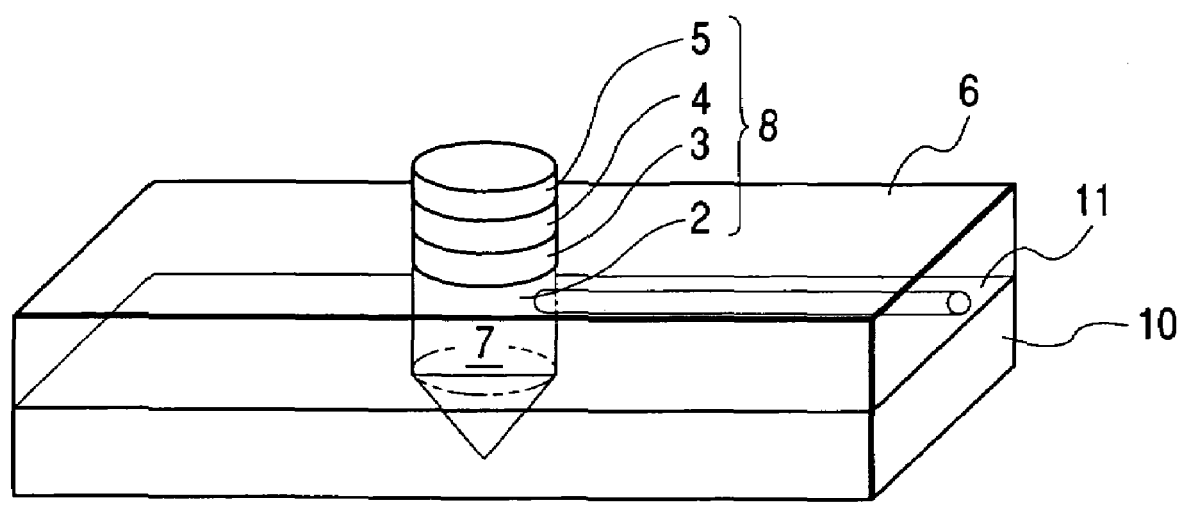
FIG. 5 is a schematic perspective view showing a head employed in an evaluation of the ink jet recording head.

An ink jet recording head was formed, on each of the elements prepared in Examples 1, 2 and Comparative Example 1, by mounting a nozzle plate 10 provided with nozzles as shown in FIGS. 4 and 5 and forming an ink introducing path 11.

(Evaluation of Ink Jet Recording Head)

In thus prepared ink jet recording head, the ink chamber 7 was filled by introducing an ink jet ink from the introducing path. Then an AC voltage of 1 to 20 kHz, 10 V was applied between the upper electrode and the lower electrode, and an ink discharge state was observed under a microscope. As a result, ink droplets could be discharged at any frequency in Examples 1 and 2. On the other hand, the ink droplets could not discharged uniformly within a range of 15 to 20 kHz in comparative example 1.

This application claims priority from Japanese Patent Application No. 2003-311305 filed on Sep. 3, 2003, which is hereby incorporated by reference herein.

What is claimed is:

1. A piezoelectric element comprising a vibrating plate, a lower electrode, a piezoelectric film and an upper electrode laminated in this order, wherein
   the lower electrode, the upper electrode and the piezoelectric film are formed of a perovskite type oxide while the vibrating plate is formed of a perovskite type metal oxide,
   the piezoelectric element includes (i) between the vibrating plate and the lower electrode, a region where a substance constituting the vibrating plate and a substance constituting the lower electrode are mixed, (ii) between the lower electrode and the piezoelectric film, a region where a substance constituting the lower electrode and a substance constituting the piezoelectric film are mixed, and (iii) between the piezoelectric film and the upper electrode, a region where a substance constituting the piezoelectric film and a substance constituting the upper electrode are mixed,
   a junction interface is substantially absent between the vibrating plate and the lower electrode, between the lower electrode and the piezoelectric film, and between the piezoelectric film and the upper electrode,
   each of the regions (i), (ii) and (iii) has a perovskite crystal structure, and
   each of the lower electrode and the upper electrode is independently formed by $M1RuO_3$ (M1 being at least one selected from a group consisting of Sr, Ba and Ca) or $Sr_{(1-x)}M2_{(x)}CoO_3$ (M2 being at least one selected from a group consisting of La, Pr, Sm and Nd; and x satisfying $0 \leq x < 1$).

2. A piezoelectric element according to claim 1, wherein the lower electrode, the upper electrode, the piezoelectric film and the vibrating plate are prepared by a sol-gel method.

3. A piezoelectric element according to claim 1, wherein the piezoelectric film is formed by $Pb_{(1-x)}La_x(Zr_yTi_{1-y})O_3$ (where $0 \leq x < 1$ and $0 \leq y \leq 1$).

4. An ink jet recording head comprising a pressure chamber communicating with an ink discharge port, and a piezoelectric element for causing a volume change in the pressure chamber for discharging ink from the discharge port,
   wherein, as the piezoelectric element, a piezoelectric element according to claim 1 is provided in such a manner that the vibrating plate thereof corresponds to the pressure chamber.

5. An ink jet recording head according to claim 4, wherein a plurality of units, each unit constituted by the pressure chamber, the discharge port and the piezoelectric element, is provided on a common substrate.

6. A method for producing a piezoelectric element according to claim 1, wherein each of the vibrating plate, the lower electrode, the piezoelectric film and the upper electrode constituting said piezoelectric element constitutes a unit, and a transition portion from one to the other of two adjacent ones of said units is formed by laminating a layer containing a precursor of a metal oxide constituting the one unit and a layer containing a precursor of a metal oxide constituting the other unit and sintering these layers.

7. A producing method according to claim 6, wherein each of said units is formed by repeating a coating and a drying plural times using a coating liquid containing a precursor of a metal oxide constituting said unit to form a layer containing said precursor, and an uppermost layer thereof is sintered simultaneously with a sintering of a precursor of a metal oxide to be laminated on the uppermost layer and to constitute a next unit.

8. A method for manufacturing a piezoelectric element according to claim 1, the method comprising the following steps performed in the following order:
provinding a vibrating plate material for forming the vibrating plate, on a substrate;
drying the vibrating plate material;
providing an electrode material for forming the lower electrode on the vibrating plate material;
drying the electrode material;
providing a piezoelectric material for forming the piezoelectric film, on the electrode material;
drying the piezoelectric material; and
sintering the vibrating plate material, the electrode material and the piezoelectric material.

9. A method for manufacturing a piezoelectric element according to claim 8, wherein a sintering is not executed between the step of drying the vibrating plate material and the step of providing the electrode material, or between the step of drying the electrode material and the step of providing the piezoelectric material.

10. A method for manufacturing a piezoelectric element according to claim 8, further comprising:
a step of providing an electrode material for forming the upper electrode on the piezoelectric material and a step of drying the electrode material, between the step of drying the piezoelectric material and the step of sintering.

11. A piezoelectric element comprising a vibrating plate, a lower electrode, a piezoelectric film and an upper electrode laminated in this order, wherein
the lower electrode, the upper electrode and the piezoelectric film are formed of a perovskite type oxide while the vibrating plate is formed of a perovskite type metal oxide,
the piezoelectric element includes (i) between the vibrating plate and the lower electrode, a region where a substance constituting the vibrating plate and a substance constituting the lower electrode are mixed, (ii) between the lower electrode and the piezoelectric film, a region where a substance constituting the lower electrode and a substance constituting the piezoelectric film are mixed, and (iii) between the piezoelectric film and the upper electrode, a region where a substance constituting the piezoelectric film and a substance constituting the upper electrode are mixed,
a junction interface is substantially absent between the vibrating plate and the lower electrode, between the lower electrode and the piezoelectric film, and between the piezoelectric film and the upper electrode, and
each of the regions (i), (ii) and (iii) has a perovskite crystal structure.

* * * * *

UNITED STATES PATENT AND TRADEMARK OFFICE
CERTIFICATE OF CORRECTION

PATENT NO. : 7,399,066 B2 Page 1 of 1
APPLICATION NO. : 10/928277
DATED : July 15, 2008
INVENTOR(S) : Kubota et al.

It is certified that error appears in the above-identified patent and that said Letters Patent is hereby corrected as shown below:

ON THE COVER PAGE:
At Item (56), References Cited, Foreign Patent Documents, "JP 2003282987 10/2003" should read --JP 2003-282987 10/2003--.

COLUMN 5:
Line 15, "Also" should read --Also,--.

COLUMN 6:
Line 20, "vibrating-plate" should read --vibrating plate--.

COLUMN 7:
Line 18, "Also" should read --Also,--.

COLUMN 10:
Line 2, "Also" should read --Also,--.

COLUMN 11:
Line 26, "Also" should read --Also,--.
Line 62, "not" should read --not be--.

Signed and Sealed this

Twenty-fourth Day of February, 2009

JOHN DOLL
*Acting Director of the United States Patent and Trademark Office*